United States Patent
Lodge et al.

(10) Patent No.: US 6,718,508 B2
(45) Date of Patent: Apr. 6, 2004

(54) HIGH-PERFORMANCE ERROR-CORRECTING CODES WITH SKEW MAPPING

(75) Inventors: John Lodge, Kanata (CA); Andrew Hunt, Ottawa (CA); Paul Guinand, Fitzroy Harbour (CA)

(73) Assignee: Her Majesty the Queen in right of Canada, as represented by the Minister of Industry through the Communication Research Centre

(*) Notice: Subject to any disclaimer, the term of this patent is extended or adjusted under 35 U.S.C. 154(b) by 411 days.

(21) Appl. No.: 09/864,253

(22) Filed: May 25, 2001

(65) Prior Publication Data

US 2002/0010892 A1 Jan. 24, 2002

Related U.S. Application Data

(60) Provisional application No. 60/207,195, filed on May 26, 2000.

(51) Int. Cl.$^7$ .............................................. H03M 13/00
(52) U.S. Cl. ........................................ 714/780; 714/777
(58) Field of Search ................................ 714/788, 733, 714/786, 755, 780, 777; 375/262

(56) References Cited

U.S. PATENT DOCUMENTS

| | | | |
|---|---|---|---|
| 5,446,747 A * | 8/1995 | Berrou ........................ | 714/788 |
| 5,533,032 A * | 7/1996 | Johnson ....................... | 714/733 |
| 5,721,745 A * | 2/1998 | Hladik et al. ................ | 714/786 |
| 6,038,696 A * | 3/2000 | Chouly et al. ............... | 714/786 |
| 6,122,763 A * | 9/2000 | Pyndiah et al. .............. | 714/755 |
| 6,526,538 B1 * | 2/2003 | Hewitt ........................ | 714/780 |
| 6,594,318 B1 * | 7/2003 | Sindhushayana ............ | 375/262 |

OTHER PUBLICATIONS

J. Lodge, P. Hoeher, and J. Hagenauer, "The decoding of multi–dimensional codes using separable MAP 'filters'," in *Proc. 16$^{th}$ Biennial Symp. on Commun.*, Kingston, Canada, pp. 343–346, May 1992.

A. Hunt, S. Crozier, and D. Falconer, "Hyper–codes: High–perfomrance low–complexity error–correcting codes," in *Proc. 19$^{th}$ Biennial Symp. on Commun.*, Kingston, Canada, pp. 263–267, May 1998.

(List continued on next page.)

Primary Examiner—David Ton
(74) Attorney, Agent, or Firm—Anne Kinsman; Borden Ladner Gervais LLP

(57) ABSTRACT

A method for generating new forward error correction codes, called skew codes, for the reliable transmission of data in noisy channels is disclosed. The method involves adding additional sets of parity equations across the third dimension of a cubic array of bits. The parity equations are applied to the cubic array such that the rectangular patterns of one square array do not match up with a rectangular pattern in another square array. By selecting skew mapping parameters of the parity equations from a set of quadratic residues of prime numbers according to specific design rules, the resulting codes are well suited to low-complexity high-speed iterative decoding, and have error correction performance and error detection capability, particularly for applications requiring high code rates. An improved decoding method for decoding skew codes and any code that is defined by a set of sum-to-identity parity equations initially decoded using an algorithm that provides confidence values on all the symbols at every symbol time is also disclosed. Generally, the improved decoding method will make hard decisions based upon the soft decisions passed from the failed iterative decoding system to provide a valid code word, through manipulation of the parity check matrix and reduction of its columns and rows.

12 Claims, 9 Drawing Sheets

OTHER PUBLICATIONS

D. Rankin and T.A. Gulliver, "Randomly interleaved single parity check codes", in *Proc. IEEE Pacific Rim Conference on Communications, Computers and Signal Processing*, Victoria, pp. 420–423, Aug. 1999.

C. Berrou and A. Glavieux, "Near optimum error–correcting coding and decoding: Turbo codes," *IEEE Trans. On Commun.*, vol. 44, No. 10, pp. 1261–1271, Oct. 1996.

J. Hagenauer, E. Offer, and L. Papke, "Iterative decoding of binary block and convolutional codes," *IEEE Trans. on Information Theory*, vol. 42, No. 2, pp. 429–445, Mar. 1996.

S. Crozier, J. Lodge, P. Guinand, and A. Hunt, "Performance of turbo–codes with relative prime and golden interleaving strategies," in *Proc. $6^{th}$ Int. Mobile Satellite Conference*, Ottawa, Canada, pp. 269–275, Jun. 1999.

\* cited by examiner

HIGH-PERFORMANCE ERROR-CORRECTING CODES WITH SKEW MAPPING

This application claims the benefit of Provisional Application No. 60/207,195 filed May 26, 2000.

FIELD OF THE INVENTION

The present invention relates to methods of data encoding. In particular, the present invention relates to a method of encoding data for error correction and decoding error encoded data.

BACKGROUND OF THE INVENTION

The communication of data intensive information has increased with the advent of wireless and internet technologies, and consequently, consumers and businesses are demanding increased speed and accuracy in their data communication systems.

Wireless mediums such as digital cellular and satellite communications channels are inherently noisy, resulting in transmissions having a large number of errors. Re-transmission of the data is typically required, reducing system performance and efficient use of available bandwidth.

A solution that has been used for several years to enable efficient, high quality data communication over noisy channels is forward error correction codes (FEC). FEC technology adds redundant information to a data stream, to enable a receiver to identify and correct errors without the need for re-transmission of data. The correcting process is called forward error correction because the receiving decoder only uses the information received and never requests a re-transmission, hence the flow of data is always moving forward. FEC coding of data is typically performed in the modulator of a communication system, and decoding of the encoded data is typically performed in the demodulator of the system.

Included among the types of FEC codes are low-density parity-check (LDPC) codes and turbo-codes, for example. Specific classes of LDPC codes have been investigated by R. G. Gallager in the paper titled "Low-density parity-check codes", in IRE Transactions on Information Theory, pp. 21–28, January 1962, J. Lodge et al. in the paper titled "The decoding of multi-dimensional codes using separable MAP 'filters'" in Proc. $16^{th}$ Biennial Symp. On Commun., Kingston, Canada, pp. 343–346, May 1992, A. Hunt et al. in the paper titled "Hyper-codes: High-performance low-complexity error-correcting codes" in Proc. $19^{th}$ Biennial Symp. On Commun., Kingston, Canada, pp. 263–267, May 1998, and D. Rankin et al. in the paper titled "Randomly interleaved single parity check codes" in Proc. IEEE Pacific Rim Conference on Communications, Computers and Signal Processing, Victoria, pp. 420–423, Aug. 1999. Many LDPC codes are well suited to high code-rate applications, as compared to turbo codes, as presented by C. Berrou et al. in the paper titled "Near optimum error-correcting coding and decoding: Turbo codes" IEEE Trans. On Commun., vol. 44, no. 10, pp. 1261–1271, October 1996. Turbo codes excel at low to moderate code rates when the signal-to-noise ratio (SNR) is also low to moderate, but can experience a flattening, or flaring of the bit-error rate (BER) curve at SNRs that limit the ultimate power efficiency for very low packet-error rate applications. This flaring is due to the existence of low-weight code words.

Fundamentally, FEC technology is a type of error-correction code. An error-correction code is a method of coding information messages in a manner that incorporates redundancy. By exploiting this redundancy, a decoder for an error-correcting code is able to provide error-correcting and/or detecting functionality. However, redundancy as incorporated within error-correction codes does not necessarily imply an exact duplication of data.

Herein, the term error-correction code, referred to as a code from this point forward, is defined as a mapping of information messages to code words, each code word being an ordered collection of symbols from some finite symbol set. Each code word of a code has the same code word length. A symbol set is a collection of distinct identifiers, such as $\{0\ 1\}$ or $\{1\ \beta\ \beta^2\ \beta^3\}$. The code words of a code form a proper subset of all possible ordered collection of symbols from the symbol set, and the collections of a size are equal to the code word length. Some ordered collections of symbols from the symbol set are code words of the code, and others are not, and this is what provides the required redundancy.

The symbol set of the code has an associated operator, called addition, defined over the elements of the symbol set, with one of the symbols in the symbol set being the identity element for the addition operator. Further, each element must have an inverse and the addition operator must be commutative, in other words, the operator is insensitive to the ordering of the operands. For example, a+b=b+a. In mathematical terms, the symbol set together with the addition operator form an abelian group.

Typically, a set of constraints determines which ordered collections of symbols are code words of a code and which are not. The constraints are expressed in terms of one or more operators that are associated with the symbol set. Highly structured constraints are usually desirable to enable simple encoding and decoding of a code. The constraints are usually defined over groups or fields, which have well-known mathematical properties.

A code where the information message is part of the code word itself is called a systematic code. That is, with a systematic code, the information messages are expressed in terms of the same symbol set used for the code words themselves, and the symbols of the information message appear within the associated code word, in some arbitrary but fixed placement pattern.

Block codes are codes having a finite code word length. Linear codes are identified when the sum of every pair of code words is a code word. Binary codes have symbols that are bits, such as 0 and 1. A product code is a code constructed from two or more codes, called component codes of the product code, which are combined in an orthogonal manner. Specifically, an N-dimensional product code is a code composed of N component codes, where each code word of the product code can be represented as an N-dimensional array of symbols. For any selected dimension and any set of valid indices for other dimensions, the ordered collection of symbols determined by moving along the selected dimension while keeping the indices of the other dimensions fixed, is a code word of the component code associated with the selected dimension. It is noted that a component code of a product code may itself be a product code.

Parity is a well-known method of applying constraints for coding. Using even-parity with bits, a constraint exists that a set of symbols sums modulo-2 to 0. For example, a set of message information bits $\{1\ 0\}$ are encoded as the code word $\{1\ 0\ 1\}$, and a set of message information bits $\{1\ 1\}$ are encoded as the code word $\{1\ 1\ 0\}$. Even-parity with bits, in the binary case, is a special case of sum-to-identity parity for general symbol sets.

Error correcting capability can be improved by creating larger, more powerful codes. A method of creating a larger and more powerful code from one or two linear component codes is to arrange the message information symbols in a rectangular array, or matrix, and then form a product code by applying parity equations along the rows and columns of the array. More specifically, one set of parity equations, called row parity equations, corresponding to the row component code is applied along the rows and a second set of parity equations, called column parity equations, corresponding to the column component code is applied along the columns resulting from the application of the first set of parity equations. The resulting two-dimensional product codes have a minimum distance equal to the product of the minimum distances of the row and column component codes, and the arithmetic difference patterns between two product code words are linear combinations of simple rectangular (i.e., weight 4) patterns. Additional dimensions could be added by stacking the product code words of the message information array to form a 3-dimensional array. Then, a third set of parity equations could be applied straight through the third dimension to form a 3-dimensional product code. In other words, a rectangular pattern in one two-dimensional product code word can match up with a rectangular pattern in another two-dimensional product code word As a simple example of a product code, consider a two-dimensional binary product code where each of two component codes are even-parity codes with a code word length of 3. The following collection of bits is a valid code word for such a product code:

1 0 1

0 1 1

1 1 0

Observe that each row and each column has even parity. This product code has only 16 distinct code words. Each code word has a code word length of 9. It is apparent that without constraints, there are $2^9$, or 512 possible ordered collections of bits of length 9.

As previously mentioned, further dimensions can be added to the product code to improve the error correcting capability of existing product codes. For example, the two-dimensional product code shown above has a minimum Hamming distance of 4, in which a minimum of 4 bits must be changed within a product code word to produce another valid product code word. By adding a third dimension of even-parity encoding with code word length of 3, the minimum Hamming distance is increased to 8. This larger Hamming distance is indicative of more powerful error-correcting capabilities. However, in order to achieve this increased error-correcting capability, 19 of 27 bits within the product code word are devoted to parity information. In the two-dimensional product code shown above, nearly half the bits are information, whereas in the three-dimensional product code, less than one third of the bits is information bits. In this example, the percentage of information bits within a code word drops significantly when an additional dimension is added to the product code. In order to increase this percentage, an increased amount of information bits is required, which is also a potential limitation to most systems.

Many linear codes, and all binary linear codes, can be defined by a set of sum-to-identity parity equations, where each parity equation is applied to a distinct subset of symbols in the code word.

Although product coding for coding source data provides good error-correction capability, conventional product coding techniques have some disadvantages. An increase in the number of dimensions of a product code is accompanied by a significant increase in the block size, and a significant drop in the code rate. The block size is a measure of the amount of message information associated with each code word and the code rate is a measure of the overhead of a code. Therefore, conventional product coding techniques can provide greater error-correcting capabilities, but at the expense of block size and code rates which contribute to a decrease in the overall system performance. For a given block size and code rate, there are many other codes that can provide error-correcting capabilities superior to that of block codes.

Once the data has been encoded and transmitted, a receiving station must decode the data to be used. Product codes are often decoded using a posteriori probability (APP) processing, or approximations thereof, applied in an iterative manner.

Initially, the decoder is passed soft decisions from the detector, which is a device that detects the signal received over an unreliable channel. The received signal can consist of elements of a symbol set. Soft decisions are a set of real numbers that is indicative of the confidence that the corresponding element in a symbol set was the one that was transmitted, for each symbol interval in the received signal. Typically, the greater the magnitude of the soft decision, the more likely it is that the corresponding symbol was the one originally transmitted. The prior art iterative decoding methods attempt to improve these soft decisions by taking advantage of the structure of the code on a component code by component code basis. When the iterative decoding is successful, it will converge to a code word within a given maximum number of iterations. That is, after the maximum number of iterations is completed, a valid code word is obtained by choosing the symbol with the highest confidence in each symbol interval. Unfortunately, prior art iterative decoding methods can result in decoding errors or decoding failures. A decoding error occurs in the case where the iterative processing has converged to an incorrect code word. A decoding failure occurs in the case where the iterative processing has not converged to a code word. This condition can be detected because the parity equations have not been satisfied. In a practical implementation, an on-chip convergence test can be run to determine that further iterations are not beneficial, such as by comparing signal to noise ratio's between current and previous iterations for example. Although re-transmission of the data is possible when decoding has failed, this option is not always practical. Therefore, while conventional iterative decoding methods are well suited to decode powerful codes, they sometimes result in decoding failures. When these decoding failures occur, it may be possible to recover the correct code word some of the time.

It is therefore desirable to provide an improved product coding method that has greater error-correcting capability than conventional product codes for a given block size and code rate.

It is further desirable to provide an improved method for recovering valid code words following a decoding failure when using iterative decoding methods.

SUMMARY OF THE INVENTION

It is an object of the present invention to provide an improved product coding method that has greater error-correcting capability than conventional product codes for a given block size and code rate, and to provide an improved method for recovering valid code words following a decoding failure when using iterative decoding methods.

In a first aspect, the present invention provides a method for error correction encoding of source data elements. The method includes determining quadratic residues of p and storing the quadratic residues of p in a memory, where p is a prime number>3 and determining if (p−1)/2 is an element of the set of quadratic residues of p. Depending on the determination, one or more sets of skew parameters based on the determination of the element are selected. The method further includes the following steps of forming symbol subsets based upon the rows, columns and one or more skew mapping paths through a 3-dimensional array, applying the parity constraints to the symbol subsets to form a parity check matrix, and generating a composite code generator matrix from the parity check matrix. In presently preferred embodiments, the step of selecting one or more sets of skew parameters includes selecting one skew parameter or all skew parameters of the at least one or more sets of skew parameters from the set of quadratic residues of p. In yet another preferred embodiment, the step of selecting one or more sets of skew parameters includes selecting all skew parameters of the at least one or more sets of skew parameters from outside the set of quadratic residues of p. In a further aspect of the present embodiment, the step of applying includes applying the parity constraints only to the rows and the third dimension of the array. In yet another aspect of the present embodiment, the step of selecting includes selecting different skew parameters between one set and another set of the skew parameters. According to alternate aspects of the present embodiment, size of the code word is reduced by shortening or by puncturing.

In a further aspect, shorter component codes are used with the skew mappings by eliminating selected parity squares prior to applying the parity constraints. In another aspect, the at least one group of symbol subsets is given by $$[\{A(s, r^*_{s,i}, c^*_{s,i})\}_{s \in J_i} | r=0 \ldots p-1, c=0 \ldots p-1],$$

where $J_i$ is an index set defining a subset of parity squares for the ith component code which uses the mapping $$\begin{bmatrix} r^*_{s,i} \\ c^*_{s,i} \end{bmatrix} = G_i(s) \begin{bmatrix} r \\ c \end{bmatrix} + v_i(s)$$

where $G_i(s)$ is a nonsingular matrix in mod-p arithmetic and $v_i(s)$ is a vector.

In a further aspect, there is provided a method for decoding received data elements representing source data elements, which uses as input values the soft decisions output from an iterative decoder. The method includes the steps of determining the maximum absolute value of the soft decisions for each symbol, reordering the columns of the parity check matrix in decreasing order of absolute values and reducing the parity check matrix rows and columns beginning with the last column until a number of columns equal to the matrix rank, n−k, have been reduced, using a one from the rightmost unprocessed column that is not all zero. The method then proceeds with the steps of forming the pseudo-systematic code generator matrix that corresponds to the reduced parity check matrix, selecting at least one pseudo-input-data word based upon the post-iterative-decoding of soft decisions, and generating entire code words that correspond to the at least one of the pseudo-input-data word and storing the code words in a memory. A code word is selected that is most similar to the pre-iterative-decoded soft decisions and the decoded source data is extracted from the systematic positions of the decoded code word.

In another aspect, there is provided a method for decoding product codes including the steps of passing soft decision data to a decoder, iteratively decoding the soft decision data until there is convergence to a code word, and incrementing a counter after each decoding iteration, and terminating iterative decoding when there is convergence to a code word, or when the counter reaches a pre-set value, or when the decoder has failed to converge to a code word. Finally, when the counter value equals a set maximum value or when the decoder fails to converge to a code word, the method of the present aspect decodes the soft decision data according to the previously described method for decoding received data elements representing source data elements, which uses as input values the soft decisions output from an iterative decoder. In a presently preferred embodiment, the step of terminating iterative decoding includes determining that the decoded data has converged to a code word when all of the parity constraints are satisfied.

According to a further aspect of the present invention, there is provided an error correction encoder. The error correction encoder includes a quadratic residue calculator, a memory, a skew parameter unit, a parity constraints generator, a composite code generator, and a data encoder. The quadratic residue calculator generates quadratic residues of a prime number p, where p>3. The memory stores the quadratic residues of the prime number p. The skew parameter unit selects from the set of quadratic residues skew mapping parameters based on a determination of (p−1)/2 being an element of the set of quadratic residues. The parity constraints generator generates a parity check matrix based upon the skew mapping parameters. The composite code generator produces a generator matrix from the parity check matrix. The data encoder receives source data and the generator matrix for providing a code word.

In yet another aspect, there is provided a decoder. The decoder includes an iterative decoder, an absolute value calculator, a matrix modifier engine, a code generator engine, a memory, a code word comparator, and a data extractor. The iterative decoder receives soft decisions and provides improved soft decisions based upon the parity structure of the code. The absolute value calculator computes the maximum absolute value of the soft decisions from the iterative decoder for each symbol time. The matrix modifier engine reduces rows and columns of a parity check matrix. The code generator engine receives the reduced parity check matrix and at least one pseudo-input-data word for generating code words corresponding to the pseudo-input-data word. The memory stores the code words. The code word comparator provides a code word that is most similar to the pre-iterative-decoded soft decisions. The data extractor decodes the code word and provides source data.

BRIEF DESCRIPTION OF THE DRAWINGS

Preferred embodiments of the present invention will now be described, by way of example only, with reference to the attached Figures, wherein.

DETAILED DESCRIPTION

The present invention provides a method for designing a new family of FEC codes having greater error correcting capabilities than conventional three dimensional product codes, that are suited for low-complexity high-speed iterative decoding. More specifically, the present invention applies one or more component coding operations through the third dimension in a way that achieves superior distance properties by explicitly avoiding the situation where a rectangular pattern in one two-dimensional product code word can match up with a rectangular pattern in another two-dimensional product code word. This is achieved by using skew mapping parity equations of the present invention, and has the effect that low-weight error events in one parity square will rarely match up with low-weight error events in other parity squares.

Figure 1:
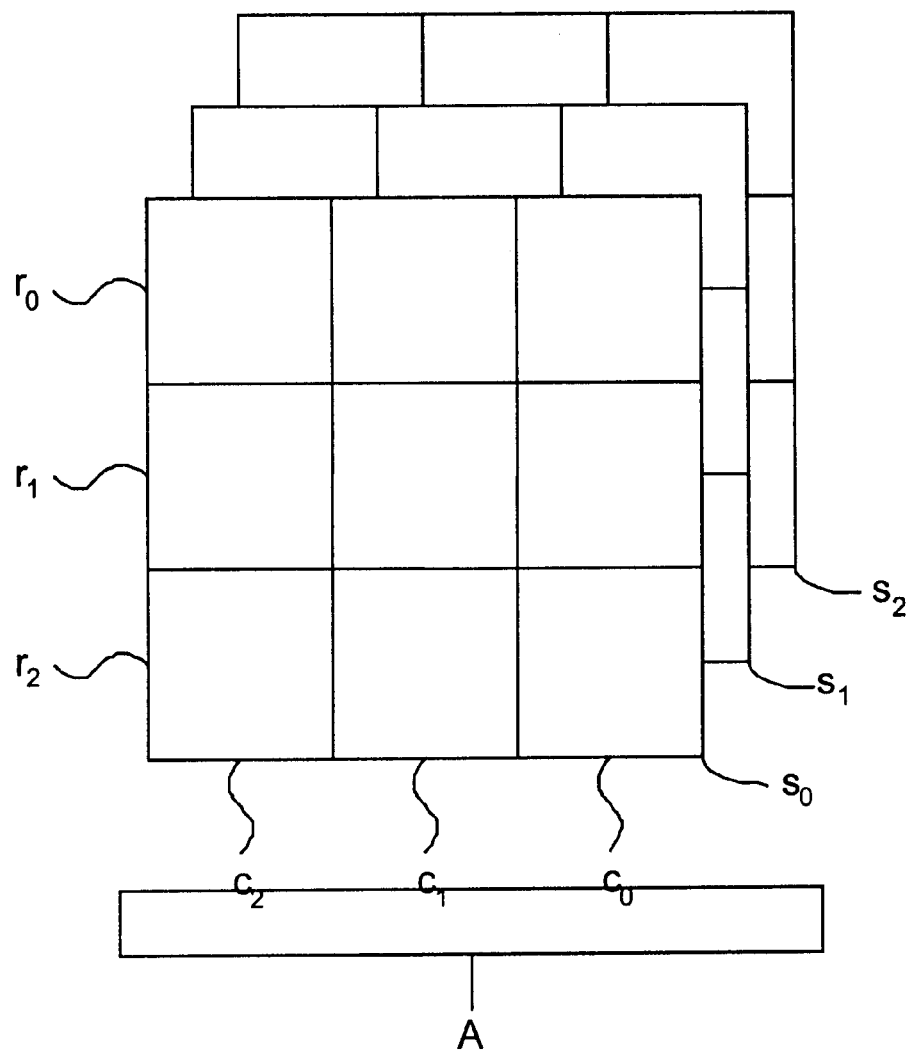
FIG. 1 is a schematic illustration of a three dimensional code word structure of the prior art.

FIG. 1 shows a schematic representation of a conventional three dimensional code word structure upon which the skew mapping parity equation embodiments of the present invention are applied to in order to generate a skew code. Code word A is a three dimensional array of symbols. Array A has $p^3$ elements, where p is a prime number. For indexing the elements of code word A, the notation $A(s,r,c)$ is used, where s denotes a square array, r denotes the row in the square array, and c denotes the column in the square array. The square array is defined as a two-dimensional product code for which both the row and column component codes have code words of length p.

The following discussion describes the method by which a single set of skew parity equations are selected for the construction of a skew code according to a first embodiment of the present invention. In the present embodiment, the operations for performing indexing will be done using modulo-p arithmetic, over the elements $\{0,1,\ldots,p-1\}$, and parity equations will be applied to the elements of code word A, which are code symbols, using the addition operation for the corresponding group or field. For a fixed value of s, the resulting 2-dimensional array is a 2-dimensional product code with parity applied along the rows and along the columns according to the row component and the column component codes, respectively. This corresponds to applying the parity constraints to each of the following collections of sets of symbols:

$$[\{A(s,r,0),\ldots,A(s,r,p-1)\}|s=0\ldots p-1, r=0\ldots p-1], \quad (1)$$

$$[\{A(s,0,c),\ldots,A(s,p-1,c)\}|s=0\ldots p-1, c=0\ldots p-1]. \quad (2)$$

It should be noted that in the paper titled "High Code Rate Iteratively-Decoded FEC Codes with Low Complexity and High Minimum Distance" published by John Lodge, Andrew Hunt and Paul Guinand in Proc. $20^{th}$ Biennial Symposium On Communications, Kingston, Canada, pp. 8–12, May 28, 2000, the component codes described were restricted to be single-bit parity equations in which all the symbols along a row, column, or skewpath summed to zero. According to the embodiments of the present invention, the subset of symbols will have to satisfy a more complicated set of parity equations, such as those coresponding to a Hamming code for example.

The elements for the additional sets of code symbols that run through the squares are selected in a more complicated manner. A single additional component code for which the sets of code symbols are selected such that each set has one and only one element in each parity square, is applied to the square array. As the elements are selected for a given set of code symbols, by incrementing index s for example, the row and column indices weave through each square array in a manner defined by:

$$[\{A(s,r^*_s,c^*_s)\}_{s=0}^{p-1}|r=0\ldots p-1, c=0\ldots p-1], \quad (3)$$

where $$\begin{bmatrix} r^*_s \\ c^*_s \end{bmatrix} = \begin{bmatrix} 1 & 0 \\ \kappa_r s & 1 \end{bmatrix} \begin{bmatrix} 1 & \kappa_c s \\ 0 & 1 \end{bmatrix} \begin{bmatrix} r \\ c \end{bmatrix}. \quad (4)$$

The skew mapping parameters given in (4) are $\kappa_r$ and $\kappa_c$.

The following discussion describes how skew mapping parameters $\kappa_r$ and $\kappa_c$ are chosen so that the vertices of a rectangle in one square cannot map to the vertices of a rectangle in another square. For the case where the component codes are single-bit parity equations, if $\kappa_r$ and $\kappa_c$ are not chosen with this constraint, then the parity equations could be satisfied by a code word with a minimum weight of 8. A person skilled in the art would understand that higher weight code words provide superior high-SNR error correction performance and error detection capability than low weight code words. A matrix M(s) is defined as $$M(s) = \begin{bmatrix} 1 & 0 \\ \kappa_r s & 1 \end{bmatrix} \begin{bmatrix} 1 & \kappa_c s \\ 0 & 1 \end{bmatrix}. \quad (5)$$

Two distinct squares, with indices denoted by s1 and s2, have points $$\begin{bmatrix} r^*_{s1} \\ c^*_{s1} \end{bmatrix} \text{ and } \begin{bmatrix} r^*_{s2} \\ c^*_{s2} \end{bmatrix}$$

in the same parity equation only if $$\begin{bmatrix} r^*_{s2} \\ c^*_{s2} \end{bmatrix} = B(s1,s2) \begin{bmatrix} r^*_{s1} \\ c^*_{s1} \end{bmatrix}, \quad (6)$$

where $$B(s1,s2)=M(s2)M^{-1}(s1). \quad (7)$$

The elements of B(s1,s2) are given by:
$b_{11}(s1, s2)=1+\kappa_r\kappa_c(s1)^2-\kappa_r\kappa_c(s1)(s2)$
$b_{12}(s1, s2)=\kappa_c(s2-s1)$
$b_{21}(s1, s2)=\kappa_r(s2-s1)[1-\kappa_r\kappa_c(s1)(s2)]$
$b_{22}(s1, s2)=1+\kappa_r\kappa_c(s2)^2-\kappa_r\kappa_c(s1)(s2)$.

The linear mapping in (6) will map the four vertices of a rectangle in square s1 to the four vertices of a rectangle in square s2 only if the following condition is met: The rectangular basis in s1 is mapped to a rectangular basis in s2 if B(s1,s2) is one of either a diagonal matrix or a skew diagonal matrix. For example, a skew diagonal matrix would have zeroes in the diagonal elements, and the off diagonal elements are non-zero.

An analysis of the limitations of the diagonal matrix case and skew diagonal matrix case to satisfy the above-mentioned condition now follows. The diagonal case cannot occur if $\kappa_c$ is chosen to be non-zero, because $b_{12}(s1,s2)$ will always be non-zero for distinct squares. Parameter $\kappa_r$ should also be chosen to be non-zero so that $b_{2,}(s1,s2)$ is usually non-zero. If the two off-diagonal elements are non-zero, two symbols in the same row or column in s1 will always map to distinct rows or columns in s2, respectively.

In considering the skew diagonal case, for the two diagonal elements to be equal, then $(s1)^2=(s2)^2$. The diagonal elements can be zero-values or otherwise. Consequently, either s1=s2 or s1=−s2. The case where s1=s2 is not of interest because in this case the squares are not distinct. In the case where s1=−s2, the diagonal elements are expressed as $$1+2\kappa_r\kappa_c(s1)^2 \tag{8a}$$

Setting (8a) equal to zero yields the condition:

$$(s1)^2 = \left(\frac{p-1}{2}\right)\kappa_r^{-1}\kappa_c^{-1} \tag{8b}$$

The left-hand side of the equation is a quadratic residue of p, and consequently the right-hand side must also be a quadratic residue. If the condition in (8b) cannot be met, then the skew diagonal case is not possible. This leads to the following design rules:

i) If $\left(\frac{p-1}{2}\right)\epsilon Q$, one and only one of $\kappa_r$ and $\kappa_c$ is selected from Q, where Q denotes the set of quadratic residues of p.

ii) If $\left(\frac{p-1}{2}\right) \notin Q$, both or neither of $\kappa_r$ and $\kappa_c$ are selected from Q.
The choice of which case of the design rule to apply can be determined by computing all of the quadratic residues of p, and then determining if $\left(\frac{p-1}{2}\right)\epsilon Q$.

Alternatively, it is straightforward to show that this is the case only if p≡1,3 mod 8.

Figure 2:
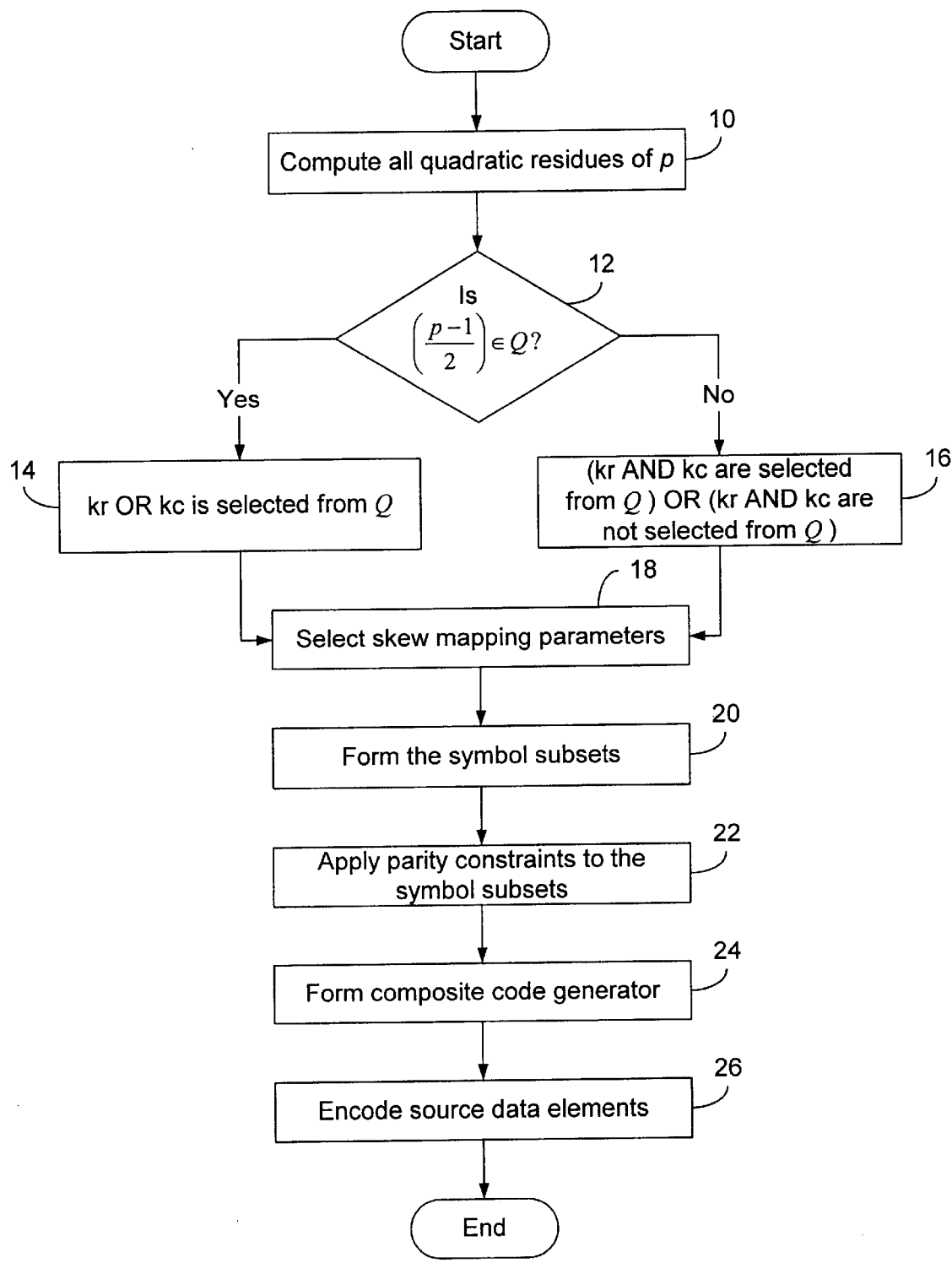
FIG. 2 is a flow chart illustrating an error correction coding algorithm according to a first embodiment of the present invention.

Therefore, an algorithm for encoding source data incorporating the above mentioned analysis is shown in the flow chart of FIG. 2 as the first embodiment of the present invention. Having data to be coded and transmitted, all the quadratic residues of p are computed in step 10. Proceeding to step 12, the algorithm must determine if (p−1)/2 is an element of Q. If yes, then one of skew mapping parameters $\kappa_r$ and $\kappa_c$ is selected from Q and the other is selected from the elements not in Q, in step 14. If no, then both or none of the skew mapping parameters $\kappa_r$ and $\kappa_c$ are selected from Q in step 16. Depending on the design rule selected, the algorithm proceeds to step 18, where the specific values for $\kappa_r$ and $\kappa_c$ are selected. In step 20, p-element subsets of symbols are defined as those consisting of any row, column, or path as defined by the skew mapping through the cubic array. In step 22, the parity constraints are applied to the subsets of symbols defined in previous step 20. The parity constraints are those corresponding to the component codes, and the component codes for the columns, rows, and the third (skew) dimension can be the same or distinct. A composite code generator is formed from the complete collection of parity constraints in step 24. The composite code generator is a n×n−k matrix. There are a number of known methods to form such a code generator matrix from a parity check matrix, hence further discussion regarding formation of the code generator is not required. It should be noted that given a specific parity check matrix, the resulting generator matrix is not unique, and vice versa. The data elements are then encoded with the composite code generator to provide the code word in step 26. More specifically, the code generator is multiplied by the (n−k)-element data vector, and the resulting n-element vector is the encoded signal. According to an alternate aspect of the present embodiment, quadratic residues of p do not need to be computed. In the alternate aspect, it is only necessary to determine if p≡1,3 mod 8 is true or not. If true, then p is a quadratic residue.

Figure 3:
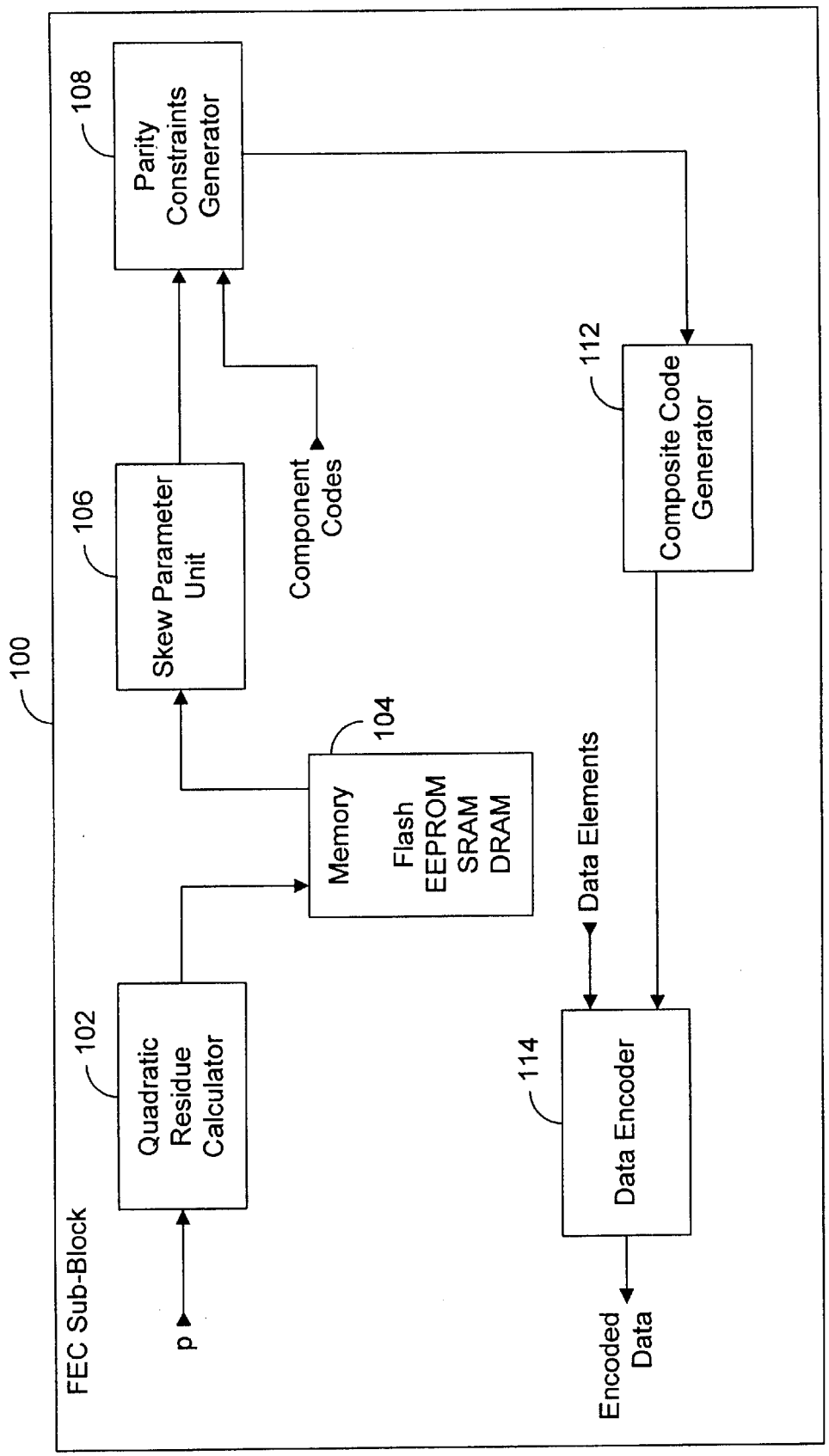
FIG. 3 shows a block diagram of an error correction encoder of a modulator according to a second embodiment of the present invention.

The skew mapping algorithm of the first embodiment can be executed in modem chips, and more specifically, in a modulator block of a digital application specific integrated circuit (ASIC) that is responsible for converting digital information into an analog compatible form prior to transmission. FIG. 3 illustrates an error correction encoder block diagram of a modulator according to a second embodiment of the present invention, for executing the skew mapping algorithm of the first embodiment. A person skilled in the art will understand that typical modulators would include additional circuit blocks to provide modulator functionality, but will not be discussed as they are not relevant to the present invention. FIG. 3 is described with reference to the flow chart of FIG. 2. Encoder 100 includes a quadratic residue calculator 102, memory element 104, memory could be used to store the parity check matrix, which is computed by the "Parity Constraints Generator", and the systematic generator matrix, which is computed by the "Composite Code Generator". The parity check matrix is need by the decoder., skew parameter unit 106, parity constraints generator 108, composite code generator 112 and data encoder 114.

In operation, quadratic residue calculator 102 receives a value p from the modulator, which is a prime number selected according to the desired transmission block size, and generates all the quadratic residues of p as described in step 10 of FIG. 2. Each quadratic residue is stored in a memory 104, which can be of any suitable memory type such as Flash, EEPROM, SRAM, or DRAM for example. Although memory 104 is shown as a block inside encoder 100, it can be a dedicated memory chip located outside encoder 100. Alternatively, the entire encoder, or even the entire modulator can be formed as a system-on-chip (SoC) device having integrated memory within it. Skew parameter unit 106 performs steps 12, 14, 16 and 18 of FIG. 2 and compares the resulting calculation from step 12 against the stored quadratic residues in memory. Skew mapping parameters are selected and provided along with the component code parity equations to the parity constraints generator 108 where step 20 and 22 from FIG. 2 is executed. The resulting parity constraints from generator 108 are fed to the composite code generator 112. The composite code generator 112 is responsible for producing a generator matrix for the composite code, as described in step 24 of FIG. 2. The code generator matrix is fed to the data encoder 114 which is responsible for encoding data elements with the composite code to provide a code word, or encoded data, as described in step 26.

Figure 4:
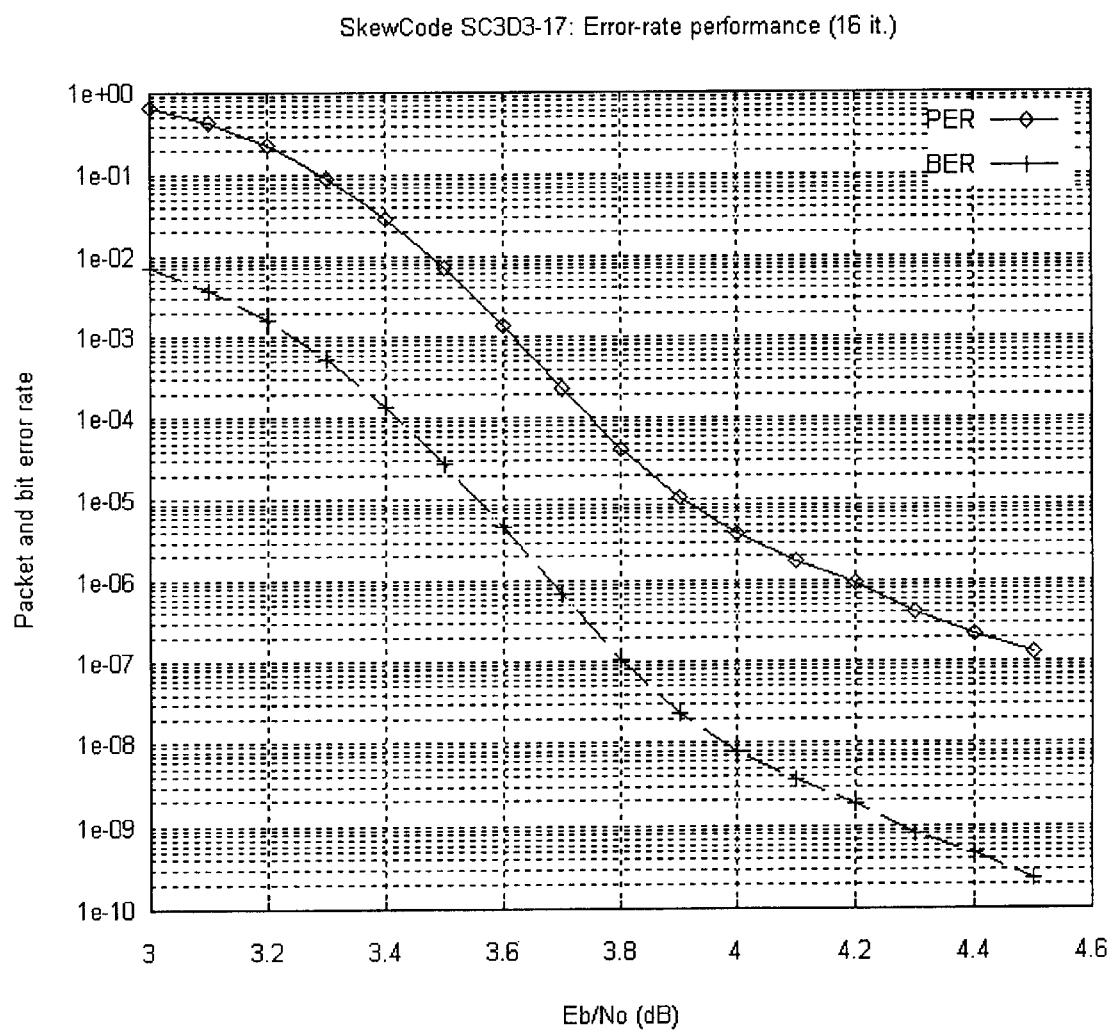
FIG. 4 is a graph illustrating bit and packet error rate performance for a first simulation example employing the first embodiment of the present invention.
Figure 5:
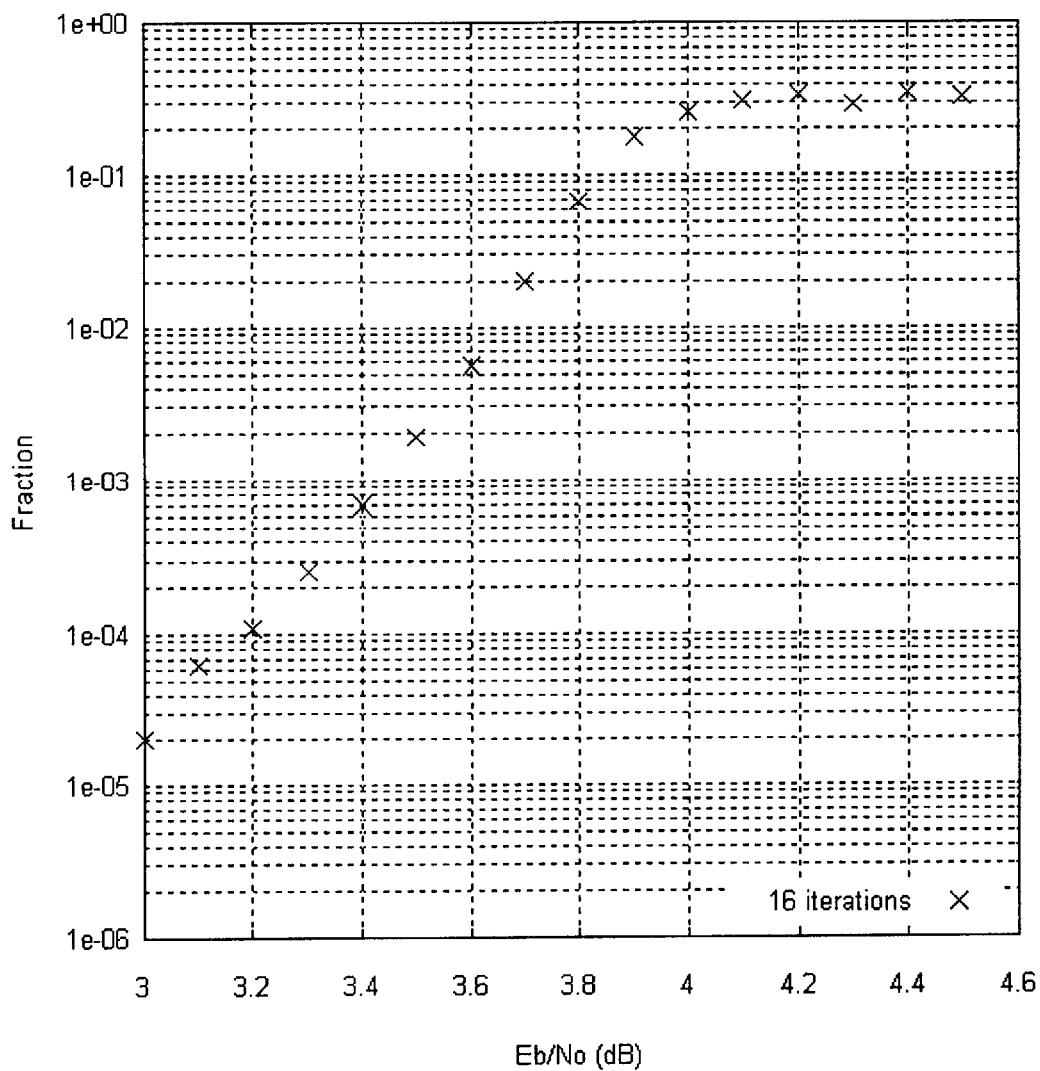
FIG. 5 is a graph illustrating the fraction of the erroneous code words that converged to valid code words in the first simulation example.

A first simulation example shown in FIGS. 4 and 5 illustrates the use of a single set of skew parity equations. For this and the following examples, the component codes are selected to be single-bit parity codes. The single set of skew parity equations is defined through a cubic array, and consequently each bit is involved in three parity equations. The prime number, p, is selected to be 17, which is equal to 1 modulo-8. The values used for $\kappa_r$ and $\kappa_c$ are 2 and 3 respectively, in which 2 is a quadratic residue, and 3 is not a quadratic residue. The resulting code parameters are (n,k)=(4913,4063), giving a code rate of R=0.82. It is noted that a conventional three dimensional product code construction would have a k=4096, which allows for 33 additional information bits to be transmitted. This slight reduction in throughput is the trade-off for significantly stronger error protection. The bit and packet error rate performances are shown in FIG. 4, where 16 iterations were used for decoding. From FIG. 4, the curves start to flare at an $E_b/N_o$ of about 3.8 dB. At low signal-to-noise ratios, where the curve is quite steep, when an error occurs it is usually because the iterative decoding process fails to converge to a valid code word. However, as the curve begins to flare, an increasing portion of the error events consist of valid code words at a low Hamming distance from the correct one, as shown in FIG. 5. Most of the converged erroneous code words are at a Hamming distance of 12 away from the correct one. The Hamming distance of 12 is the minimum distance of this code.

The previously described first embodiment of the present invention used only a single set of skew parity equations to achieve a stronger code than the corresponding three dimensional code of the prior art. The minimum distance obtained is 12 as opposed to 8, and there are relatively few of the lower weight code words. However, a stronger code can be constructed according to a third embodiment of the present invention.

According to the third embodiment of the present invention, a stronger code can be constructed by using two distinct skew mappings, with each of the mappings defining code symbol sets for a corresponding component code. Two such distinct sets can be $(\kappa_r^1, \kappa_c^1)$ or $(\kappa_r^2, \kappa_c^2)$ for example. Consequently each symbol is in four component code words. The skew parameters can be selected such that $\kappa_r^1 \kappa_c^1 \neq \kappa_r^2 \kappa_c^2$, so that the two skew mappings are as different as possible.

Referring to (4), it can be seen that both skew mappings will share a common set of code symbols when r and c are both equal to zero. In order to avoid this occurrence, equation (4) can be generalized to:

$$\begin{bmatrix} r^*_{s,i} \\ c^*_{s,i} \end{bmatrix} = \begin{bmatrix} 1 & 0 \\ \kappa_r^i s & 1 \end{bmatrix} \begin{bmatrix} 1 & \kappa_c^i s \\ 0 & 1 \end{bmatrix} \begin{bmatrix} r \\ c \end{bmatrix} + \begin{bmatrix} r_o^i \\ c_o^i \end{bmatrix}, \quad (9)$$

for the ith skew mapping. The two offset vectors can be chosen arbitrarily with the exception that they should be distinct. Simulations using two distinct skew mappings have not shown any occurrences of small error events. The skew codes of the third embodiment exhibit excellent distance properties for applications where extremely low error rates are required because there is no observable flare in the error rate curves.

Figure 6:
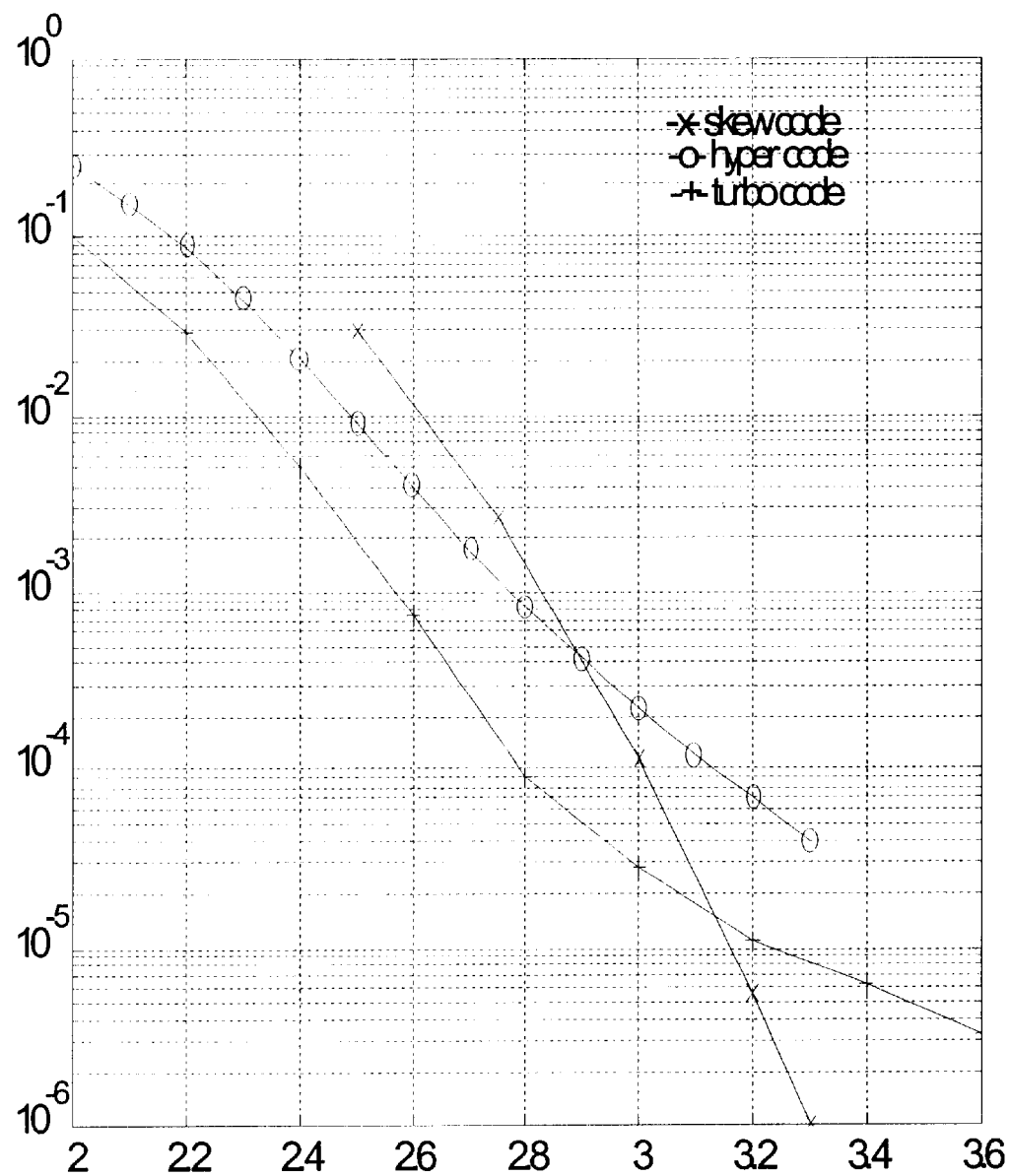
FIG. 6 is a graph illustrating packet error rate performance for a second simulation example employing the third embodiment of the present invention.

A second simulation example to illustrate the use of two distinct sets of skew parity equations according to the third embodiment of the present invention is shown in FIG. 6. Although the first simulation example illustrated improved product code distance properties over those of conventional three dimensional product codes, flaring still occurs at error rates that are higher than required for some services. The second simulation example shown in FIG. 6 shows how two distinct sets of parity equations running through the cubic array provides a stronger code. Consequently, each bit is in four parity equations. For the present example, the fixed offset vector is the 0 vector for the first set, where as both vector elements are selected to be 1 for the second set. For comparison purposes, the packet error rate performance is shown for three codes of similar block length and code rate in FIG. 6. The skew code of the present embodiment of the invention is a (1331,860) code having a code rate of R=0.646. The HyperCode from the A. Hunt et al. paper is a (1452,1000) code having a code rate of R=0.689. The turbo code from the C. Berrou et al. paper is a (1302,860) code having a code rate of R=0.661. FIG. 6 shows that while the HyperCode and the turbo-code have flared noticeably, the skew code of the present embodiment shows no sign of flaring. Furthermore, of the approximately 30,000 erroneous packets that were received in generating the skew code curve of the present embodiment, all were detected as being erroneous. This result indicates that all sets of parity equations were never simultaneously satisfied. In other words, virtually all decoding problems were failures and not errors.

Figure 7:
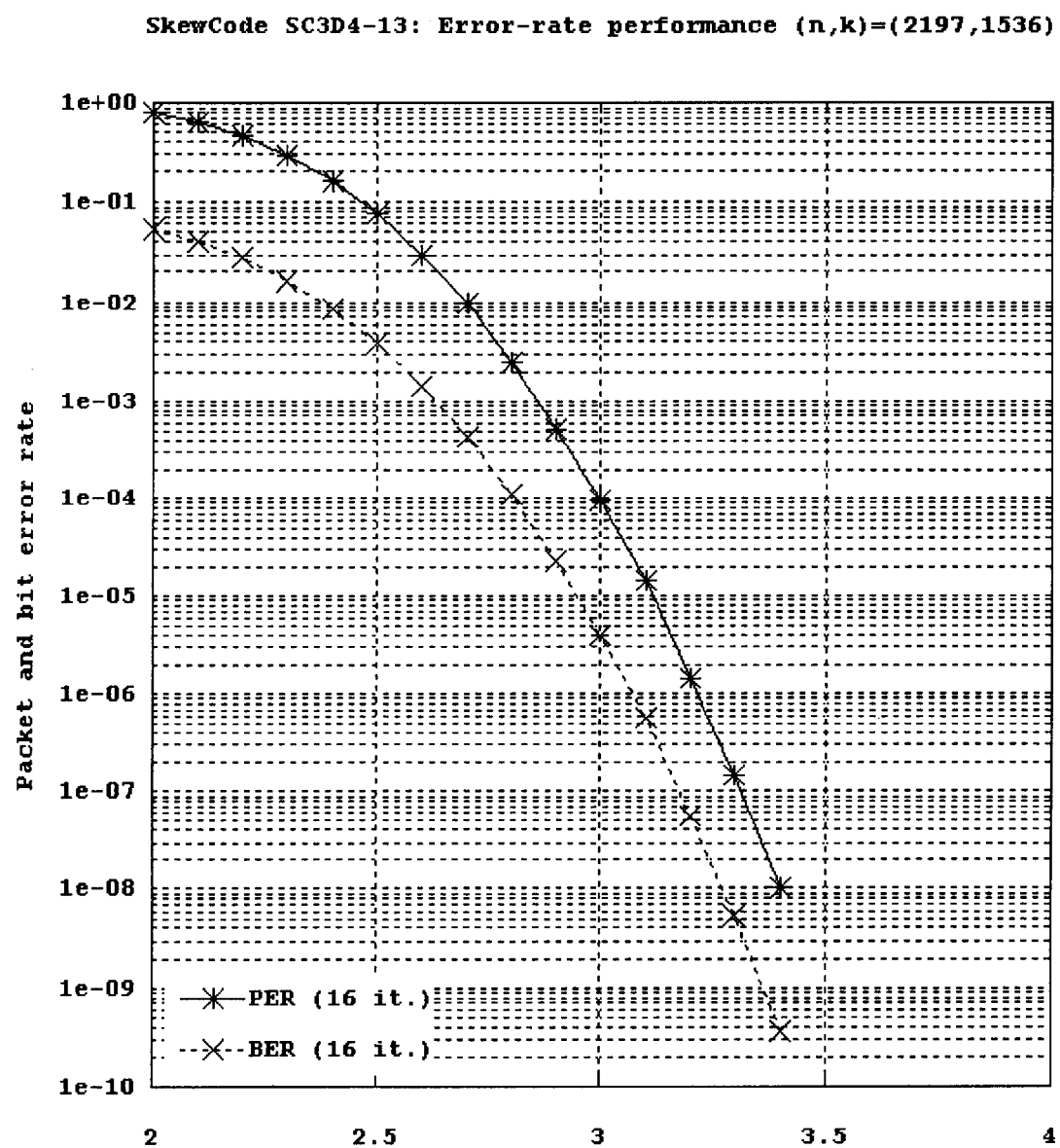
FIG. 7 is a graph illustrating packet and bit-error-rate performance for a product code designed for MPEG packet transmission employing the third embodiment of the present invention.

A third example illustrates the practical application of the skew parity equations of the third embodiment in MPEG video. Performance results for the third example are shown in FIG. 7. MPEG video data packets are highly compressed, thus any packet error can cause noticeable degradation in the picture quality. The MPEG transport layer has a frame size of 188 bytes. If four additional bytes are added to support other uses, such as system signaling, the packet size becomes 192 bytes, or 1536 bits. A product code has been designed to fit this packet size, with (n,k)=(2197,1536), and R=7/10. This product code has four sets of parity equations, and was designed with p=13 (5 modulo-8). The skew parameters are (1,3), both of which are quadratic residues, and (2,5), neither of which are quadratic residues. As in the second example, the fixed offset vector is the 0 vector for the first set of skew parity equations, where as both vector elements are selected to be 1 for the second set. FIG. 7 shows both packet-error rate (PER) and bit-error rate (BER) performance for 16 decoding iterations. Performance results were computed for a series of EbNo values, in increments of 0.1 dB. For all values of $E_b/N_o$ up to and including 3.1 dB, at least 1000 error events occurred. For 3.2, 3.3 and 3.4 dB the number of error events are 98, 66 and 5 respectively. Therefore, the lowest point on the curves is of limited accuracy. However, at low error rates, the error rates are falling by over a decade for each 0.1 dB increment in $E_b/N_o$. Furthermore, there is no sign of flaring or small weight error events.

The first and third embodiments of the present invention describes how sets of parity equations are selected for the construction of product codes, or skew codes. These sets of equations define the code's parity-check matrix, from which a systematic generator matrix can be computed and then used in the encoding process. Once encoded data has been transmitted, an iterative decoder at a receiving end sequentially performs soft-in soft-out processing on the sets of parity equations.

Iterative decoding methods similar to those used in the prior art, with appropriate customization, can be used to decode the data coded according to the embodiments of the present invention. However, such iterative decoding methods may fail due to non-convergence to a code word.

Following is a description of an improved method for iterative decoding of product codes according to a fourth embodiment of the present invention. The improved method can be used to decode the skew codes of the previously described embodiments, and any code that is defined by a set of sum-to-identity parity equations initially decoded using an algorithm that provides confidence values on all the symbols at every symbol time. The improved decoding embodiment is applied when the conventional iterative decoding technique has failed to converge. The improved decoding method of the present embodiment can be used to recover the correct code word in the second simulation example because the decoding problems were failures.

In general, the improved decoding method of the present embodiment will make hard decisions based upon the soft decisions passed from the failed iterative decoding system to provide a valid code word, through manipulation of the parity check matrix and reduction of its columns and rows.

Figure 8:
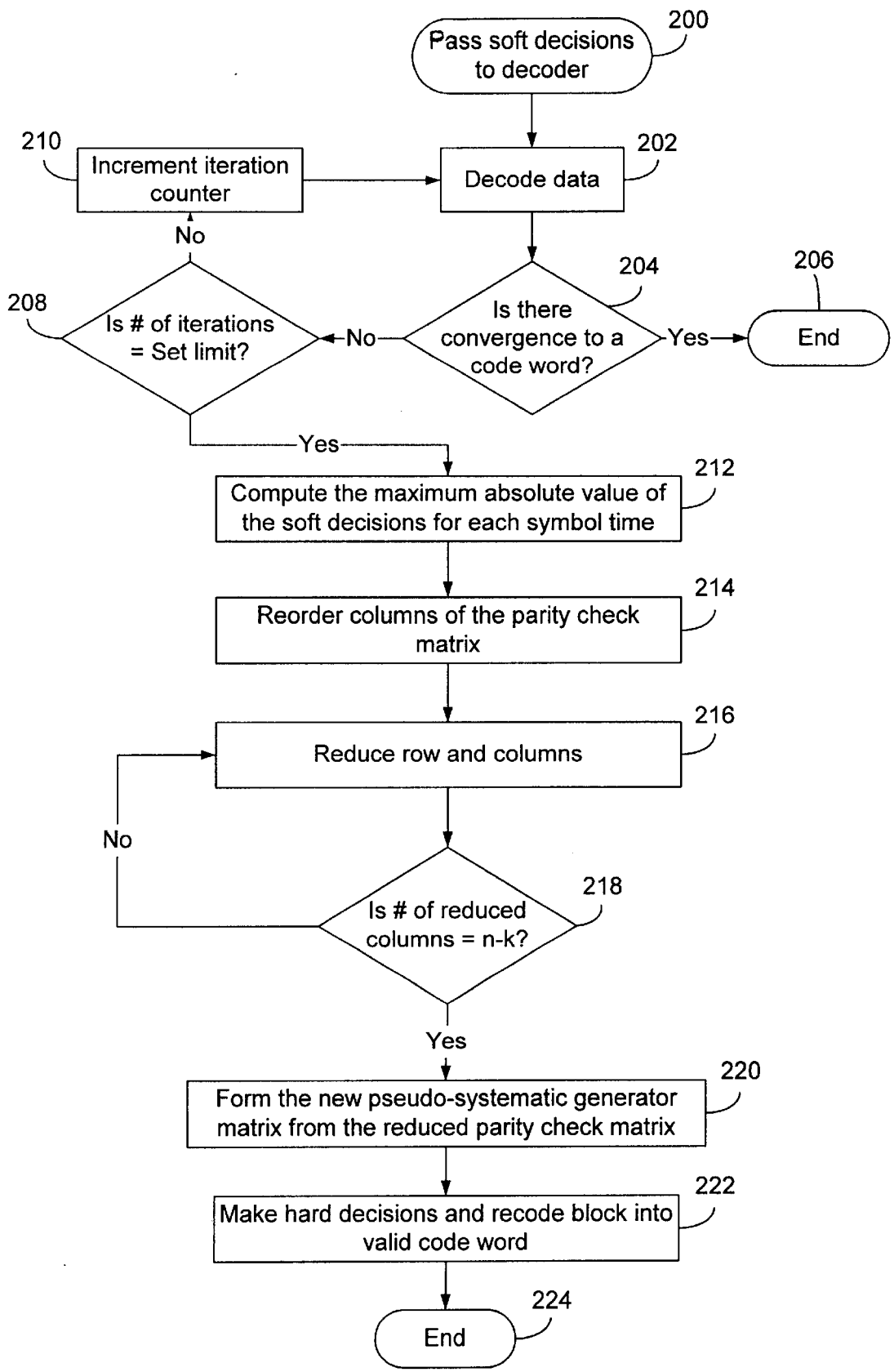
FIG. 8 is a flow chart illustrating the decoding algorithm according to a fourth embodiment of the present invention; and, FIG. 9 shows a block diagram of a decoder of a demodulator according to a fifth embodiment of the present invention.

A description of the improved decoding algorithm follows with reference to the flow chart of FIG. 8. It is assumed that error correction codes have already been designed according to the previously described embodiments of the present invention, and implemented in transmission and receiver hardware. Steps 200 to 210 are part of the standard iterative decoding procedure, and steps 212 to 224 describe the steps of the improved decoding algorithm. The process begins at step 200, where the detector of the receiver passes the soft decisions to the soft-in/soft-out decoder. An iteration counter is set to zero, and the decoder attempts to decode the data in step 202. The algorithm then checks to see if there has been convergence to a code word in step 204. If there has been convergence, then the algorithm proceeds to step 206 and ends. Otherwise, there has been no convergence, and the algorithm proceeds to step 208 where the iteration counter is compared to the set maximum limit of iterations. If the iteration counter is less than the set limit, then the algorithm loops back to decoding step 202 after incrementing the iteration counter in step 210. Otherwise, the iteration counter has reached the set limit, and the algorithm proceeds to step 212. In step 212, the maximum absolute value of the soft decisions for each symbol time is computed. These values will be referred to as the weights of the symbol time. In step 214, the algorithm reorders the columns of the parity check matrix with the columns being ordered from the largest to the smallest weight. With this ordering, recoding is performed based upon the most reliable symbols. The rows and columns are then reduced in step 216 starting with the last column, which has the smallest absolute value, by using a one from the rightmost unprocessed column that is not all zero. This involves the interchanging of both rows and columns. Step 218, determines if the number of columns reduced equals n–k (the matrix rank). If not, then the algorithm loops back to step 216 for reduction of another column. Once the number of columns reduced equals n–k, the algorithm proceeds to step 220. The row used at a given stage is determined by the first one in an unprocessed non-zero column, thus a different ordering of the original equations may yield a different result. The k positions, forming the complement of the n–k positions corresponding to the above columns, are then used to define a set of pseudo-systematic positions in step 220. The positions are not really the data positions, but are used to generate code words as if they were the data positions. In other words, code words that correspond to each of the pseudo-input-data words, which are the hard decisions corresponding to k of the more reliable symbols after the iterative decoding has failed, are generated. In step 222 hard decisions are made based upon the post-iterative-decoded soft decisions and the block is recoded resulting in a valid code word.

If some of the k symbol positions are considered to be quite unreliable, for example more than one element of the symbol set is reasonably likely to have been the one transmitted, several different valid code words can be obtained by recoding. The one element selected by the decoder is the one that is closest to the pre-iterative-decoding soft decisions. For example, for the binary case it is the one that is most highly correlated with the pre-iterative-decoding soft decisions.

The improved decoding algorithm of the fourth embodiment can be executed in a demodulator of a modem chip, in the same way that the skew mapping algorithm of the first embodiment is executed in a modem chip modulator. A demodulator is responsible for recovering a transmitted signal, and is the complement to the modulator, although one skilled in the art would understand that the demodulator involves circuits and operating principles that are different from a modulator.

Figure 9:
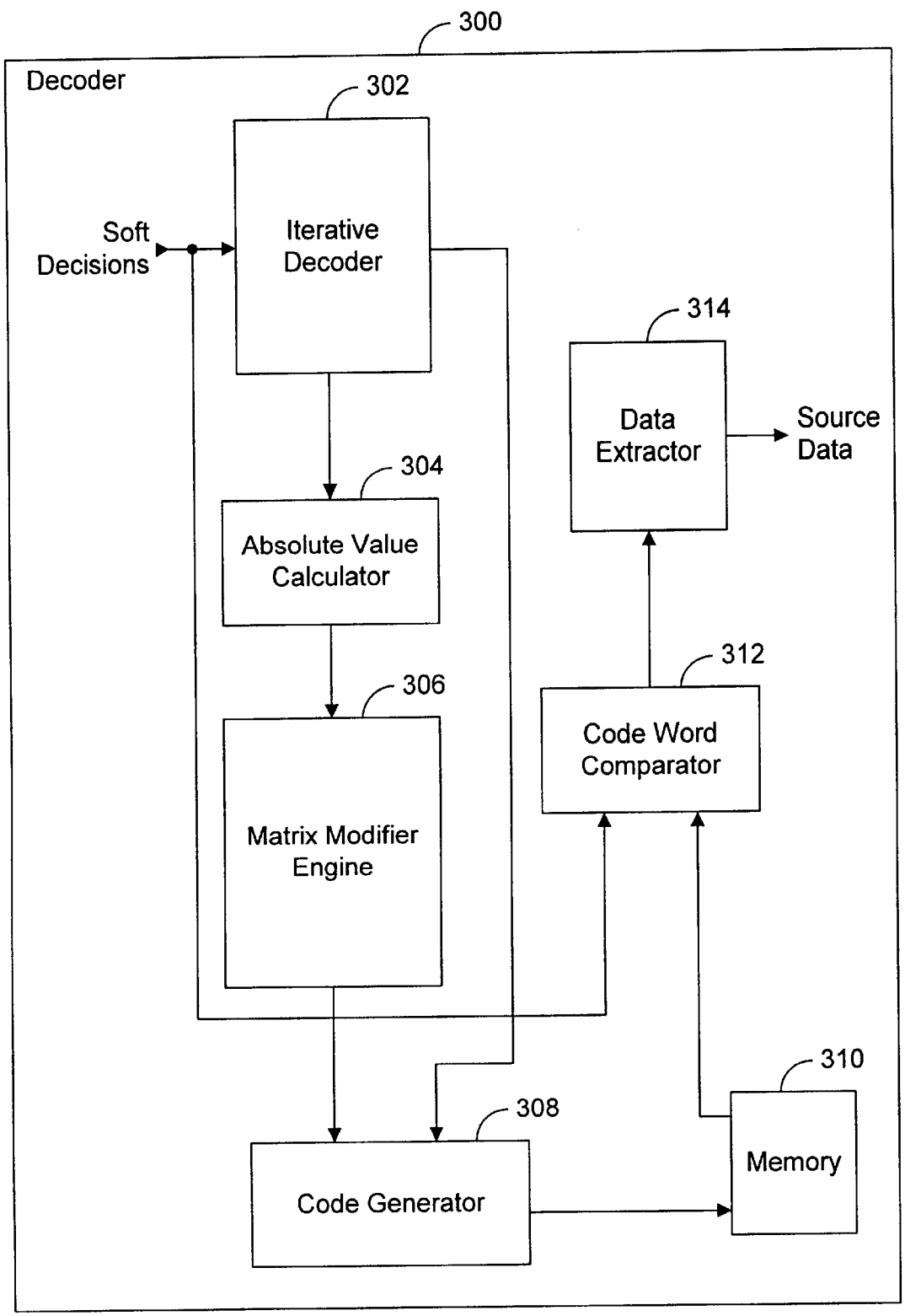

FIG. 9 illustrates a decoder block diagram of a demodulator according to a fifth embodiment of the present invention, for executing the improved decoding algorithm of the fourth embodiment of the present invention. A person skilled in the art will appreciate that a typical demodulator would include additional components to provide modulator functionality, but will not be discussed as they are not relevant to the present invention. FIG. 9 is described with reference to the flow chart of FIG. 8. Decoder 300 includes a standard iterative decoder 302, absolute value calculator 304, matrix modifier engine 306, code generator 308, memory element 310, code word comparator 312, and source data extractor 314.

In operation, iterative decoder 302 receives the soft decisions from a detector, and attempts to decode the data into a valid code word. Iterative decoder 302 executes steps 202, 204, 206, 208 and 210 from FIG. 8. When the decoder cannot converge to a code word, the soft decisions are passed to the absolute value calculator to execute step 212. Matrix modifier engine 306 is responsible for reordering the parity check matrix and then reducing its columns, as described in steps 214, 216 and 218 in FIG. 8. At least one pseudo-input-data word generated from the failed iterative decoding process is selected within iterative decoder 302 and fed to code generator 308. Code generator 308 also receives the reduced parity check matrix from the matrix modifier engine 306 and forms the pseudo-systematic code generator matrix, which is then used to generate code words that correspond to the pseudo-input-data words by multiplying the pseudo-systematic code generator matrix and the pseudo-input data words. Pseudo-input-data word generation and generation of code words corresponding to the at least one pseudo-input-data word correspond to step 222 in FIG. 8. All the code words generated by code generator 308 are stored in memory element 310. Memory element 310 can be one of the same types of memory previously discussed for the memory element 104 in FIG. 3. Code word comparator 312 compares the original soft decisions to the code words in memory element 310, and provides the code word that is closest to the original soft decisions. The identified code word is provided to data extractor 314. Data extractor 314 proceeds to extract the decoded source data after receiving the code word from the code word comparator 312.

In an alternative embodiment of the present invention, the size of the code word can be reduced by a technique called shortening, in which selected input data positions are not used and the code word is encoded using values in these positions known to both the encoder and the decoder such that they are not required to be transmitted. In yet another alternative embodiment of the present invention, puncturing can be used for reducing the size of a code word, in which selected symbols are not transmitted. In yet another embodiment of the present invention, selected subsets can be dropped prior to applying the parity constraints. For example, the code designer may choose only to apply the constraints across the subsets comprising the rows and third dimension of the array. The embodiments of the present invention can be used in wireless and optical applications, or any application in which data is transmitted across noisy channels or mediums.

The above-described embodiments of the invention are intended to be examples of the present invention. Alterations, modifications and variations may be effected the particular embodiments by those of skill in the art, without departing from the scope of the invention which is defined solely by the claims appended hereto.

We claim:

1. A method of error correction encoding of source data elements, comprising the steps of:
   a) determining a set of quadratic residues of p and storing the set of quadratic residues of p in a memory, where p is a prime number>3;
   b) determining if (p−1)/2 is an element of the set of quadratic residues of p;
   c) selecting one or more sets of skew parameters based on the determination of the element;
   d) forming symbol subsets based upon the rows, columns and one or more skew mapping paths through a 3-dimensional array;
   e) applying parity constraints to the symbol subsets to form a parity check matrix; and,
   f) generating a composite code generator matrix from the parity check matrix and encoding the source data elements with the composite code generator matrix to provide a code word.

2. The method of claim 1, wherein selecting one or more sets of skew parameters includes selecting one skew parameter of the at least one or more sets of skew parameters from the set of quadratic residues of p.

3. The method of claim 1, wherein selecting one or more sets of skew parameters includes selecting all skew parameters of the at least one or more sets of skew parameters from the set of quadratic residues of p.

4. The method of claim 1, wherein selecting one or more sets of skew parameters includes selecting all skew parameters of the at least one or more sets of skew parameters from outside the set of quadratic residues of p.

5. The method of claim 1, wherein applying includes applying the parity constraints only to the rows and the third dimension of the array.

6. The method of claim 1, wherein selecting includes selecting different skew parameters between one set and another set of the skew parameters.

7. The method of claim 1, wherein the size of the code word is reduced by shortening.

8. The method of claim 1, wherein the size of the code word is reduced by puncturing.

9. The method of claim 1, wherein shorter component codes are used with the skew mappings by eliminating selected parity squares prior to applying the parity constraints.

10. The method of claim 1, wherein the at least one group of symbol subsets is given by:

$$[\{A(s, r^*_{s,i}, c^*_{s,i})\}_{s \in I_i} | r=0 \ldots p-1, c=0 \ldots p-1],$$

where $J_i$ is an index set defining a subset of parity squares for the fh component code which uses the mapping:

$$\begin{bmatrix} r^*_{s,i} \\ c^*_{s,i} \end{bmatrix} = G_i(s) \begin{bmatrix} r \\ c \end{bmatrix} + v_i(s)$$

$G_i(s)$ is a nonsingular matrix in mod-p arithmetic and $v_i(s)$ is a vector.

11. An error correction encoder comprising:
   a quadratic residue calculator for generating a set of quadratic residues of a prime number ρ where p>3;
   a memory for storing the set of quadratic residues of the prime number ρ;
   a skew parameter unit for selecting from the set of quadratic residues skew mapping parameters based on a determination of (p−1)/2 being an element of the set of quadratic residues;
   a parity constraints generator for generating a parity check matrix based upon the skew mapping parameters;
   a composite code generator for producing a generator matrix from the parity check matrix; and,
   a data encoder for receiving source data and the generator matrix for providing a code word.

12. A decoder comprising:
   an iterative decoder for receiving soft decisions and providing improved soft decisions based upon the parity structure of the code;
   an absolute value calculator for computing a maximum absolute value of the soft decisions from the iterative decoder for each symbol time;
   a matrix modifier engine for reducing rows and columns of a parity check matrix;
   a code generator engine for receiving the reduced parity check matrix and at least one pseudo-input-data word for generating code words corresponding to the pseudo-input-data word;
   a memory for storing the code words;
   a code word comparator for providing a code word that is most similar to the pre-iterative-decoded soft decisions; and,
   a data extractor for decoding the code word and providing source data.

* * * * *

UNITED STATES PATENT AND TRADEMARK OFFICE
CERTIFICATE OF CORRECTION

PATENT NO. : 6,718,508 B2
DATED : April 6, 2004
INVENTOR(S) : John Lodge et al.

It is certified that error appears in the above-identified patent and that said Letters Patent is hereby corrected as shown below:

Title page,
Item [56], References Cited, OTHER PUBLICATIONS,
"A. Hunt" reference, delete "perfomrance" and insert -- performance --;

Drawings,
Sheet 2, Figure 2, in the block referred to by reference numeral 14, delete the phrase "kr OR kc is selected from Q" and insert -- $\kappa_r$ XOR $\kappa_c$ is selected from Q --; in the block referred to by reference numeral 16, delete the phrase "(kr AND kc are selected from Q) OR (kr AND kc are not selected from Q)" and insert -- ($\kappa_r$ AND $\kappa_c$ are selected from Q) OR ($\kappa_r$ AND $\kappa_c$ are not selected from Q) --;

Sheet 6, Figure 6 add as a label to the horizontal axis -- Eb/No (dB) --; add as a label to the vertical axis -- Packet error rate performance versus Eb/No for the AWGN channel --;

Column 2,
Line 14, delete "collection" and insert -- collections --;
Line 52, delete "of" and insert -- using --;

Column 3,
Line 20, delete "(i.e. wieght 4)";

Column 4,
Line 17, delete "block" and insert -- product --;

UNITED STATES PATENT AND TRADEMARK OFFICE
CERTIFICATE OF CORRECTION

PATENT NO. : 6,718,508 B2
DATED : April 6, 2004
INVENTOR(S) : John Lodge et al.

It is certified that error appears in the above-identified patent and that said Letters Patent is hereby corrected as shown below:

Column 10,
Line 14, delete " 'nxn-k" and insert -- nxk --;
Line 22, "n-k" and insert -- k --;
Line 46, delete "need" and insert -- needed --; delete "decoder." and insert -- decoder --; and Column 16,
Line 14, delete "fth" and insert -- ith --.

Signed and Sealed this

Seventh Day of March, 2006

JON W. DUDAS
*Director of the United States Patent and Trademark Office*